US008805305B2

(12) United States Patent
Premakanthan et al.

(10) Patent No.: US 8,805,305 B2
(45) Date of Patent: Aug. 12, 2014

(54) METHOD AND SYSTEM FOR POWER CONTROL OF A WIRELESS COMMUNICATION DEVICE

(75) Inventors: Pravin Premakanthan, Chandler, AZ (US); Michael Addison Milyard, Chandler, AZ (US); Mahibur Rahman, Chandler, AZ (US)

(73) Assignee: Intel IP Corporation, Santa Clara, CA (US)

(*) Notice: Subject to any disclaimer, the term of this patent is extended or adjusted under 35 U.S.C. 154(b) by 469 days.

(21) Appl. No.: 13/169,661

(22) Filed: Jun. 27, 2011

(65) Prior Publication Data
US 2012/0329512 A1 Dec. 27, 2012

(51) Int. Cl.
*H03C 1/62* (2006.01)
*H04B 17/00* (2006.01)

(52) U.S. Cl.
USPC ............... 455/115.1; 455/126; 455/127.2

(58) Field of Classification Search
CPC .............. H04L 27/364; H04L 27/3863; H04L 27/0014; H04B 17/0062; H04B 17/0015
USPC .......... 455/114.1, 114.2, 114.3, 115.1, 115.2, 455/115.3, 115.4, 120, 121, 126, 127.2, 129
See application file for complete search history.

(56) References Cited

U.S. PATENT DOCUMENTS

| | | | |
|---|---|---|---|
| 2007/0286307 A1* | 12/2007 | Hayashi et al. | 375/297 |
| 2009/0111399 A1* | 4/2009 | Norris et al. | 455/114.3 |
| 2009/0298448 A1* | 12/2009 | Mayer et al. | 455/127.2 |
| 2010/0240329 A1* | 9/2010 | Shizawa et al. | 455/114.3 |

OTHER PUBLICATIONS

Hao Li; "A Fast Predistortion Algorithm for radio-Frequency Power Amplifier Linearization with Loop Delay Compensation"; IEEE Journal of Selected Topics in Signal Processing, vol. 3, No. 3; pp. 10, 2009.
Wikipedia; "Least means square filter"; www.wikipedia.org ; pp. 5, Jun. 23, 2011.

* cited by examiner

*Primary Examiner* — Ping Hsieh
(74) *Attorney, Agent, or Firm* — Baker Botts L.L.P.

(57) ABSTRACT

According to the present disclosure, a method for tracking power levels of a wireless communications signal comprises receiving a feedback signal indicative of a power level of a wireless communication signal associated transmitted from a transmit path to an antenna of a wireless communication element. The method further comprises receiving a reference signal associated with a digital signal converted into the wireless communication signal. Additionally, the method comprises determining a gain of the feedback signal with respect to the reference signal and determining a gain error based on the determined gain and an expected gain.

14 Claims, 3 Drawing Sheets

METHOD AND SYSTEM FOR POWER CONTROL OF A WIRELESS COMMUNICATION DEVICE

TECHNICAL FIELD

The present disclosure relates generally to mobile communication networks, and more particularly, to a method and system for dynamic power control of a wireless communication device.

BACKGROUND

Traditional wireless communication terminals (e.g., cell phones) may use an external power detector to sense the output power of the terminal to control and adjust the output power of the terminal. However, using power detectors to sense output power may add to the cost of the terminal because of the need for the external discrete component. Additionally, selecting the appropriate detector and integrating the detector with the circuitry of the terminal may increase the cost, time and/or resources required to develop the terminal. Additionally, power control systems with external power detectors may require approximately thirty to forty microseconds (μsec) to perform gain control whereas various wireless communication protocols such as code division multiple access (CDMA) and evolution data optimized (EVDO) may require power control response times of less than seven microseconds. Further, power control systems with external power detectors may be susceptible to external blockers and interferers.

SUMMARY

In accordance with the present disclosure, disadvantages and problems associated with tracking power of a wireless communication device may be reduced. According to the present disclosure, a wireless communication element comprises a transmit path configured to convert a digital signal into a wireless communication signal. The wireless communication element further comprises an antenna coupled to the transmit path and configured to transmit the wireless communication signal. The wireless communication element also comprises a feedback receive path communicatively coupled between the antenna and transmit path. The feedback receive path is configured to receive a feedback signal indicative of a power level of the wireless communication signal transmitted from the transmit path to the antenna. The wireless communication element additionally comprises an error tracking path coupled to the feedback receive path. The error tracking path is configured to receive the feedback signal and receive a reference signal associated with the digital signal. The error tracking path is further configured to determine a gain of the feedback signal with respect to the reference signal and determine a gain error based on the determined gain and an expected gain.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
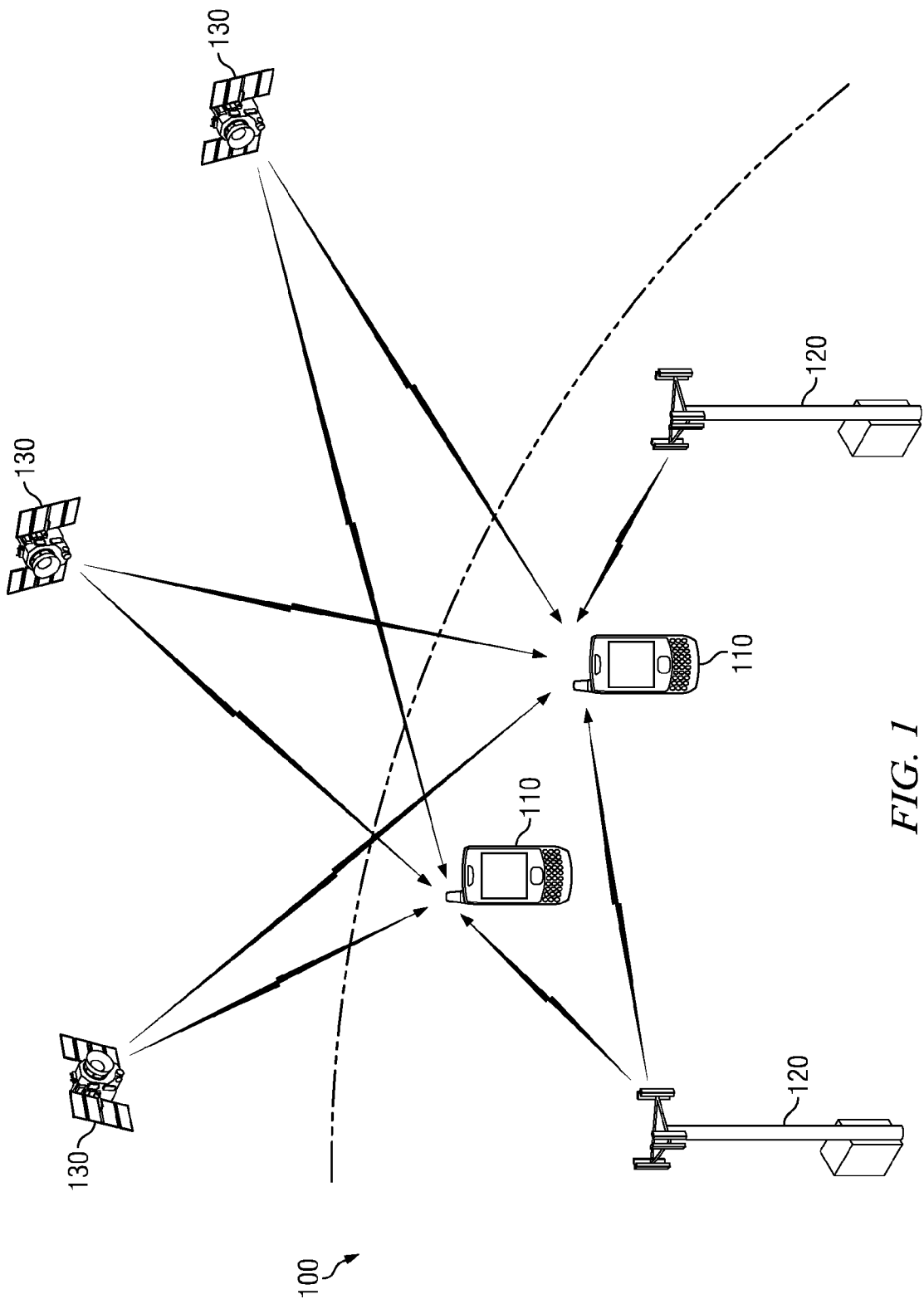
FIG. 1 illustrates a block diagram of an example wireless communication system, in accordance with certain embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

A terminal 110 may or may not be capable of receiving signals from satellites 130. Satellites 130 may belong to a satellite positioning system such as the well-known Global Positioning System (GPS). Each GPS satellite may transmit a GPS signal encoded with information that allows GPS receivers on earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

A terminal 110 may be configured to transmit signals to a base station 120 at varying signal power levels depending on a variety of parameters such that the base station 120 may receive the transmitted signal. In some instances the terminal 110 may include a power amplifier (e.g., power amplifier 220 of FIG. 2) that may amplify the signal and may be adjusted such the power of signals transmitted by the terminal 110 is at the desired level. The power amplifier may be adjusted based at least in part on detection of the transmitted signal power to ensure that the power amplifier is transmitting at the desired level. As disclosed in further detail below, the transmitted signal power may be detected using a feedback, self-receive (crx) path instead of an external discrete power detector.

As described further below, the crx path may be coupled to an error tracking path configured to receive the signal detected by the crx path ("crx signal"). The error tracking path may also be configured to receive a reference signal that is to be transmitted by terminal 110. After passing through a transmit path, the reference signal may be detected by the crx path as a crx signal, such that the crx signal may be associated with the reference signal. However, a delay may occur between reception of the reference signal and reception of the crx signal. Therefore, the error tracking path may determine the time delay between the reference signal and the crx signal such that the error tracking path may time align the reference signal with the crx signal. The error tracking path may also be configured to determine the gain of the crx signal with respect to the reference signal. Further, the error tracking path may be configured to remove an expected gain from the determined gain such that the error tracking path may determine the gain error between the actual gain and the expected gain. Once the gain error is known, the terminal 110 may adjust the signal power such that the actual gain is more closely related to the expected gain. Therefore, terminal 110 may be configured to use the error tracking path to adjust the gain of transmitted signals. The error tracking path may also be configured to determine the presence of interferers or blockers that may disrupt the transmission of the wireless communication signal transmitted by a terminal 110.

Such a configuration may allow for a power control system that does not require external power detectors. Additionally, using the crx and error tracking paths of the present disclosure, power tracking may be accomplished in a reduced amount of time as compared to implementations that may use an external power detector. Further, the error tracking path and crx path may be used to track interference that may not be detected using an external power detector.

Figure 2:
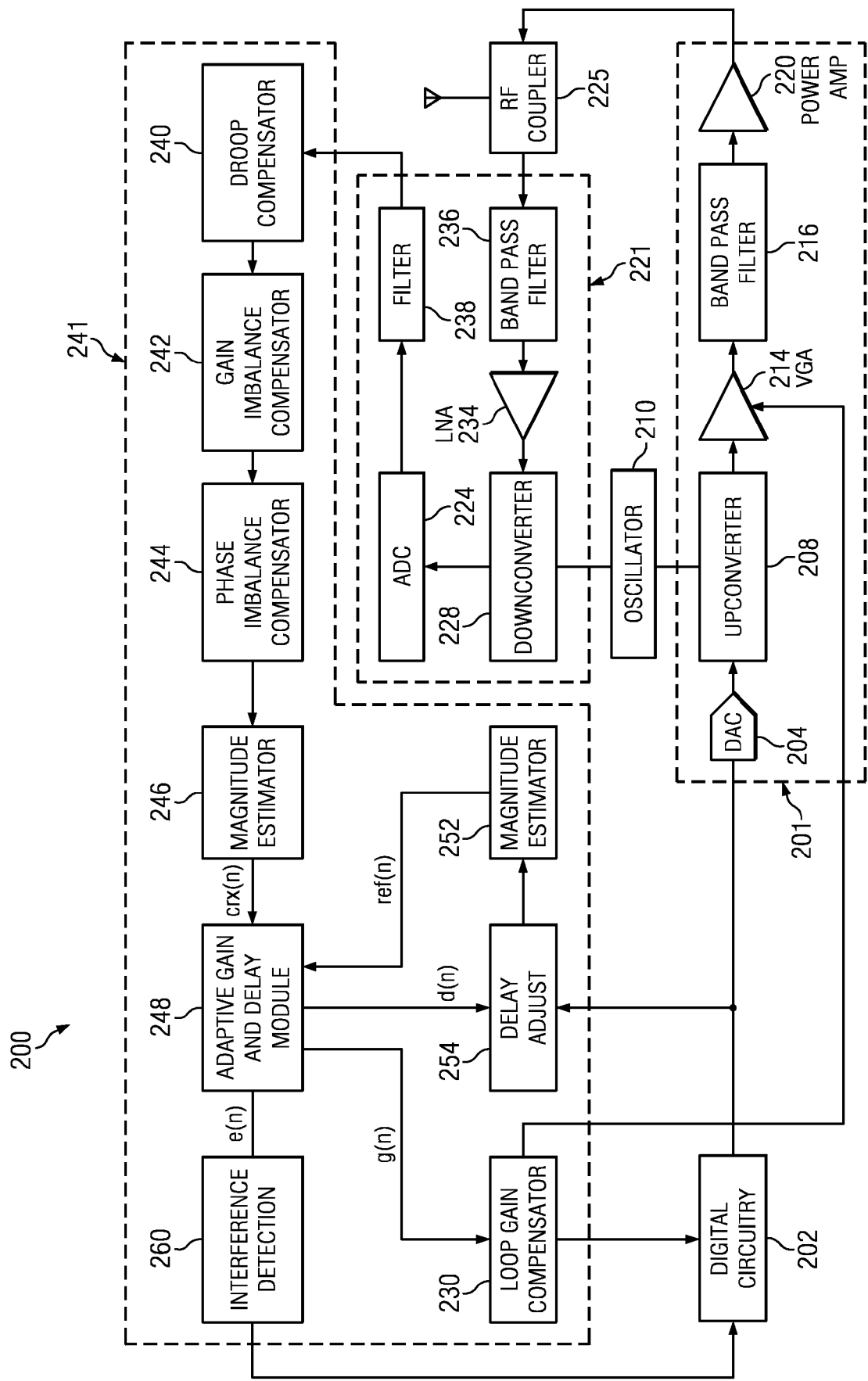
FIG. 2 illustrates a block diagram of selected components of an example transmitting and/or receiving element, in accordance with certain embodiments of the present disclosure.

FIG. 2 illustrates a block diagram of selected components of an example transmitting and/or receiving element 200 (e.g., a terminal 110, a base station 120, or a satellite 130), configured to detect the transmission power of element 200 using a crx path and error tracking path instead of a power detector to improve the power control of RF signals transmitted by element 200.

Element 200 may include a transmit path 201 and a crx path 221. Element 200 may also include a receive path not expressly shown. Depending on the functionality of element 200, element 200 may be considered a transmitter, a receiver, or a transceiver. Element 200 may also include an error tracking path 241 configured to compare a signal detected by crx path 221 with a reference signal such that power control of an RF signal being transmitted by element 200 may be achieved, as discussed further below.

Digital circuitry 202 of element 202 may include any system, device, or apparatus configured to process digital signals and information received via receive a receive path, and/or configured to process signals and information for transmission via transmit path 201. Accordingly digital circuitry 202 may comprise any system, device, or apparatus configured to interpret and/or execute program instructions and/or process data, and may include without limitation a microprocessor, microcontroller, digital signal processor (DSP), application specific integrated circuit (ASIC), or any other digital or analog circuitry configured to interpret and/or execute program instructions and/or process data. In some embodiments, digital circuitry 202 may interpret and/or execute program instructions and/or process data stored in memory communicatively coupled to and/or included in digital circuitry 202.

Memory may comprise any system, device or apparatus operable to retain program instructions or data for a period of time (e.g., computer-readable media). Memory may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to digital circuitry 202 is turned off As discussed in further detail below, digital circuitry 202 may be configured to control the power of RF signals transmitted via transmit path 201 by, for example adjusting the gain of a variable gain amplifier (VGA 214) and/or a power amplifier 220 configured to amplify one or more wireless communication signals. Digital circuitry 202 may be configured to communicate in-phase (I) channel and quadrature (Q) channel components (not expressly shown) of a digital signal to transmit path 201.

Transmit path 201 may include a digital-to-analog converter (DAC) 204. DAC 204 may be configured to receive a digital signal from digital circuitry 202 and convert such digital signal into an analog signal. Such analog signal may then be passed to one or more other components of transmit path 201, including upconverter 208.

Upconverter 208 may be configured to frequency upconvert an analog signal received from DAC 204 to a wireless communication signal at a radio frequency based on an oscillator signal provided by oscillator 210. Oscillator 210 may be any suitable device, system, or apparatus configured to produce an analog waveform of a particular frequency for modulation or upconversion of an analog signal to a wireless communication signal, or for demodulation or downconversion of a wireless communication signal to an analog signal. In some embodiments, oscillator 210 may be a digitally-controlled crystal oscillator.

Transmit path 201 may include a variable-gain amplifier (VGA) 214 to amplify an upconverted signal for transmission, and a bandpass filter 216 configured to receive an amplified signal VGA 214 and pass signal components in the band of interest and remove out-of-band noise and undesired signals. The bandpass filtered signal may be received by power amplifier 220 where it is amplified for transmission.

The amplified signal may be received by a radio frequency (RF) coupler 225 coupled between power amplifier 220 and antenna 218. RF coupler 225 may be any system, device or apparatus configured to couple at least a portion of the transmission power in the transmission line between power amplifier 220 and antenna 218 and send that transmission power to crx path 221, described in further detail. RF coupler 225 may also couple the remaining portion of the amplified signal received from power amplifier 220 and send it to antenna 218. Antenna 218 may receive the amplified signal from coupler 225 and transmit such signal (e.g., to one or more of a terminal 110, a base station 120, and/or a satellite 130). The signal amplified by power amplifier 220 and transmitted by antenna 218 may be referred to as an RF signal or a transmitted signal.

Crx path 221 may include a bandpass filter 236 configured to receive a portion of the wireless communication signal transmitted by transmit path 201 via RF coupler 225. Bandpass filter 236 may pass the in the band of interest and remove out-of-band noise and undesired signals. In addition, crx path 221 may include a low-noise amplifier (LNA) 224 to amplify the signal received from bandpass filter 236.

Crx path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal). During downconversion the signal may be divided into its I and Q channel components. In addition, crx path 221 may include an analog-to-digital converter (ADC) 224 configured to receive an analog signal from downconverter 228 and convert such analog signal into a digital signal. Such digital signal may then be passed to a filter 238 configured to remove any DC offset of the signal detected by crx path 221 ("the crx signal"). In some embodiments, filter 238 may comprise a moving average filter. Filter 238 may communicate the crx signal to error tracking path 241. Although not expressly shown, the crx signal may be separated according to its I and Q channel components, and accordingly, crx path 221 may include an ADC 224 and filter 221 for each channel component.

Error tracking path 241 may include a droop compensator 240 configured to receive the crx signal and adjust for frequency gain droop caused by downconversion. Droop compensator may be configured to accordingly amplify the I and Q channels of the crx signal with a frequency amplified gain.

Droop compensator 240 may communicate the crx signal to a gain imbalance compensator 242 configured to adjust for any gain imbalance that may be present between the I and Q channels of the crx signal such that the gain of the I and Q channels may be substantially equal. Gain imbalance compensator 242 may communicate the crx signal to a phase imbalance compensator 244 configured to adjust for any phase difference between the I and Q channels such that the I and Q channels are substantially in quadrature phase with each other (e.g., offset by a 90° phase). Phase imbalance compensator 244 may communicate the crx signal to a magnitude estimator 246.

Magnitude estimator 246 may be configured to determine the magnitude of the crx signal. In some embodiments, magnitude estimator 246 may determine the magnitude of the crx signal by taking the square root of the sum of the I channel magnitude squared and the Q channel magnitude squared. Magnitude estimator 246 may communicate the crx magnitude (crx(n), where n may represent the current sample) to an adaptive gain and delay module ("gain and delay module") 248 configured to determine the gain of the crx signal with respect to the reference signal. Gain and delay module 248 may also be configured to determine delay differences between the crx signal and a reference signal to time align the reference and crx signals such that a more accurate gain may be determined, as disclosed further below.

The reference signal may be used by gain and delay module 248, as its name denotes, as a reference to determine the gain experienced by signals being transmitted by transmit path 201 as measured by crx path 221 and indicated by the crx signal. Accordingly, gain and delay module 248 may compare the reference signal with the crx signal to determine the actual gain of the transmitted RF signal. Gain and delay module 248 may communicate the determined gain to a loop gain compensator 250. As described in further detail below, loop gain compensator 250 may compare the actual gain of the crx signal with the expected gain of the crx signal such that the gain error (e.g., difference between the actual gain and the expected gain) may be determined. With the gain error known, loop gain compensator 250 may communicate such to digital circuitry 202 such that digital circuitry 202 may adjust the gain of the signals transmitted via transmit path 201 (e.g., adjust the gain of the digital signal communicated to transmit path 201) to compensate for the gain error to more accurately control the power of the transmitted RF signal. In the same or alternative embodiments, loop gain compensator 250 and or digital circuitry 202 may also be configured to adjust the gain of VGA 214 to compensate for the gain error.

Gain and delay module 248 may also be configured to determine the delay between the crx signal and the reference signal. Gain and delay module 248 may accordingly communicate the delay to a delay adjustment module 254 such that delay module 254 may time align the reference signal with the crx signal to allow for a more accurate comparison of the reference signal gain with the crx signal gain.

Figure 3:
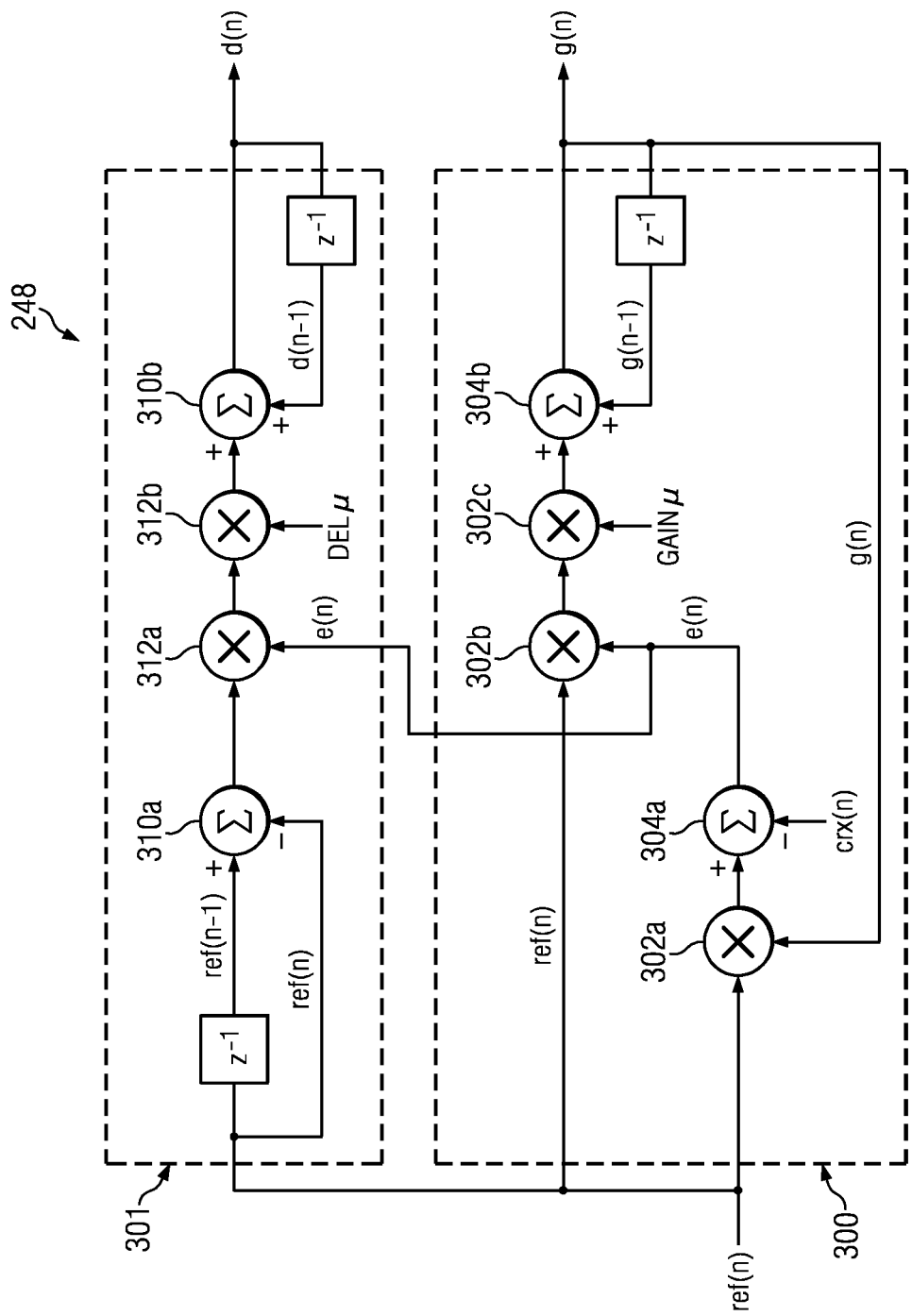
FIG. 3 illustrates an example embodiment of a gain and delay module of FIG. 2, in accordance with certain embodiments of the present disclosure.

Gain and delay module 248 may determine the gain of the crx signal with respect to the reference signal and may also determine the delay differences between the crx and reference signals using any suitable method, such as a least mean squares (LMS) or recursive least squares (RLS) algorithm. FIG. 3, described in more detail below, illustrates an embodiment that uses a least mean squares algorithm.

As mentioned above, error tracking path 241 may include a delay adjustment module 254 configured to receive a reference signal from digital circuitry 202. Additionally, as also mentioned above, although not expressly shown, the reference signal may be divided according to its I and Q channel components. Delay adjustment module 254 may receive a control signal from gain and delay module 248 that indicates the time difference between the reference signal and the crx signal. The delay may be expressed in terms of digital samples. Accordingly, delay module 254 may delay the reference signal by the number of samples indicated by gain and delay module 248.

Delay module 254 may include a plurality of delay modules configured to provide varying degrees of delay with varying degrees of delay resolution. For example, delay module 254 may include a course integer delay module configured to make course delay adjustments of the reference signal that may include a delay resolution of more than one sample at a particular sampling rate (e.g., a delay resolution of four samples at a 62.4 MHz sampling rate). Delay module 254 may also include a fine integer delay module configured to provide a delay adjustment resolution of up to one sample at the indicated sampling rate (e.g., a delay resolution of one sample at a 62.4 MHz sampling rate). Further, in the same or alternative embodiments, delay module 254 may include a fractional delay module configured to provide a delay resolution of a fraction of a sample at the indicated sampling rate (e.g., a delay resolution of 0.1 samples at a 62.4 MHz sampling rate). Accordingly, the finer the delay resolution of the fine delay adjustment, the more precise the delay adjustment may be.

Delay module 254 may communicate the time aligned reference signal to a magnitude estimator 252 configured to estimate the magnitude of the reference signal. Magnitude estimator 252 may be substantially similar to magnitude estimator 246. Magnitude estimator 252 may communicate the time adjustment magnitude of the reference signal (e.g., ref (n), where n may represent the current sample of the reference signal) to gain and delay module 248 such that gain and delay module 248 may determine the gain between of the time aligned reference and crx signals.

Upon determining the gain between the reference and crx signals, gain and delay module 248 may communicate the determined gain to a loop gain compensator 250. Loop gain compensator 250 may be configured to subtract the expected gain of the crx signal out from the determined gain to determine the gain error of the transmitted signal. The expected gain of the crx signal may be based on the expected gain of transmit path 201 and crx path 221 that may be exerted on a signal leaving digital circuitry 202 and received by gain and delay module 248 as a crx signal.

For example, a signal leaving digital circuitry 202 may experience amplification and/or attenuation within transmit path 201 such as being amplified by VGA 214 and power amplifier 220 along with experiencing attenuation at upconverter 208 and/or bandpass filter 216. Additionally, the signal may experience a loss at coupler 225 and at the pad (not expressly shown) configured to receive the feedback signal from coupler 225 for transmission through crx path 221. Additionally, the feedback signal may be amplified by LNA 234 and/or may be attenuated by downconverter 228 before entering error tracking path 241 as a crx signal. These gains and losses may be known to a certain degree such that the expected gain of a signal leaving digital circuitry 202 and received at gain and delay module 248 as a crx signal may be approximated. Therefore, loop gain compensator 250 may subtract the expected loop gain from the measured gain to obtain the gain error, which may indicate the difference between the actual gain and the expected gain.

Loop gain compensator 250 may communicate the gain error to digital circuitry 202. As mentioned above, digital circuitry 202 may accordingly account for the gain error when adjusting the gain of the transmitted signal (e.g., by adjusting the gain of the digital signal communicated to transmit path 201) such that the transmitted signal power may more closely correspond with its desired signal power. Further, as previously mentioned, in the same or alternative embodiments, loop gain compensator 250 and or digital circuitry 202 may also be configured to adjust the gain of VGA 214 to compensate for the gain error.

Gain and delay module 248 may also be configured to communicate an error signal (e(n)) to an interference detecting module 260. The error signal may indicate the difference between the crx signal and the reference signal multiplied by the determined gain. An interferer and/or blocker may cause the detected crx signal to have a much different magnitude than if the blocker were not present. Additionally, the blocker may cause the magnitude of the crx signal to change in an unpredictable manner. In such instances, the gain determined by gain and delay module 248 and applied to the reference signal may not appropriately match the gain of the crx signal with respect to the reference signal. Accordingly, the error between the crx signal and the reference signal multiplied by the determined gain may increase when a blocker is present. Thus, interference detecting module 260 may determine whether the error is above an indicated threshold and if so, may communicate a flag to digital circuitry 202 indicating that a blocker may be present. Digital circuitry 202 may address the blocker accordingly.

Therefore, crx path 221, error tracking path 241 and digital circuitry 202 may be configured to track and adjust the power of signals being transmitted by element 200. Such a configuration may not include an external power detector and may have a decreased settling time as compared to an external power detection system. Accordingly, the gain error tracking may be faster than with other power detection and tracking configurations.

Modifications, additions or omissions may be made to FIG. 2 without departing from the scope of the present disclosure. For example, as mentioned above, the reference and crx signals may include I and Q channel signal components such that crx path 221, error tracking path 241 and transmit path 201 may include components that may be configured to perform operations with respect to the I channel and other analogous components that may be configured to perform operations with respect to the Q channel. For example, element 200 may include an ADC for each channel at each analog to digital conversion and may include an amplifier for each channel, even though only one is shown in FIG. 2.

FIG. 3 illustrates an example embodiment of gain and delay module 248 of FIG. 2. In the present example, gain and delay module 248 may comprise a DSP configured to perform a least mean squares (LMS) algorithm to determine the gain and delay between ref(n) and crx(n) of FIG. 2. However, it is understood that any suitable system, apparatus or device configured to perform any suitable adaptive error detection method (e.g., an RLS algorithm) may also be used.

Gain and delay module 248 may include a gain adaptation path 300 and a delay adaptation path 301 configured to determine the gain and delay, respectively, between each digital sample of ref(n) and crx(n). Gain adaptation path 300 may be configured to perform a least mean squares algorithm that indicates the error between the gain of crx(n) with respect to ref(n) and a calculated gain g(n). Gain adaptation path 300 may also determine the gain of ref(n) with respect to crx(n) using the error as a metric and may accordingly adapt according to the error e(n). The LMS algorithm may be configured such that, for each sample, it adjusts based on the error and gain of the previous sample and may come to a steady state with little to no error. Once gain adaptation path 300 comes to the steady state with little to no error, the gain between ref(n) and crx(n) may be reasonably determined. In the present example, gain adaptation path 301 may be configured to execute the following equations to determine the gain between ref(n) and crx(n):

$$e(n)=[g(n)*\text{ref}(n)-crx(n)];$$

$$g(n)=[\text{gain}\mu*e(n)*\text{ref}(n)]+g(n-1).$$

In the above cited equations, e(n) may represent the least mean squares error, g(n) may represent the gain of ref(n) with respect to crx(n) and gainμ may represent a scaling factor that may be used to adjust the time required for gain adaptation path 300 to reach steady state.

The implementation of the above equations may be seen in FIG. 3. For example, multiplier 302a may receive ref(n) and may multiply ref(n) with g(n) to generate g(n)*ref(n) of the above equation, which may represent the magnitude of the reference signal multiplied by the determined gain. Following this multiplication, g(n)*ref(n) may be communicated to summer 304a configured to determine the difference between g(n)*ref(n) and crx(n). The difference between g(n)*ref(n) and crx(n) may indicate the error e(n) between the calculated gain (g(n)) and the actual gain experienced by crx(n) with respect to ref(n). Following this difference calculation, e(n) may be communicated to multiplier 302b where e(n) may be multiplied by ref(n) to render e(n)*ref(n) of the second equation listed above.

This product (e(n)*ref(n)) may be communicated to multiplier 302c where it may be multiplied by gainμ. As mentioned above, gainμ may comprise a scaling factor that may adjust the time required for gain adaptation path 300 to reach a steady state. The larger gainμ may be, the faster gain adaptation path 300 may reach a steady state, however, it may also cause larger oscillations while reaching steady state. Therefore, the value of gainμ may be chosen with this trade off in mind. Following multiplier 302c, (e)n*ref(n)*gainμ) may be communicated to summer 304b where it may be summed with the previous value of the calculated gain (e.g., g(n−1)) to generate the current value of the calculated gain (e.g., g(n)). The calculated gain, g(n), may loop back to multiplier 302a as a feedback to perform the above mentioned determinations and may also be output and communicated to loop gain compensator 250 as described with respect to FIG. 2.

As mentioned above, gain and delay module 248 may also include a delay adaptation path 301 configured to determine the delay (d(n)) between crx(n) and ref(n) such that d(n) may be communicated to delay adjustment module 254 (shown in FIG. 2) to accordingly adjust the delay of ref(n) to time align ref(n) with crx(n). Delay adaptation path 301 may be configured to execute the following equation to determine the delay between ref(n) and crx(n):

$$d(n)=[del\mu*(ref(n-1)-ref(n))*e(n)]+d(n-1)$$

In the above equation, delμ may represent a scaling factor similar to gainμ, ref(n−1) may represent the magnitude of the previous sample of the reference signal, ref(n) may represent the magnitude of the current sample of the reference signal, e(n) may represent the error between crx(n) and ref(n) multiplied by g(n) as determined by gain adaptation path 300. Finally, d(n−1) may represent the determined delay for the previous sample.

To implement the above delay equation, delay adaptation path 301 may include a summer 310a configured to receive ref(n) and ref(n−1) and determine the difference between the two. This difference (ref(n−1)−ref(n)) may be communicated to multiplier 312a. Multiplier 312a may be configured to also receive error e(n) from summer 304a of gain adaptation path 300 and may multiply e(n) by (ref(n−1)−ref(n)) as indicated by the delay adaptation equation above. Further, delay adaptation path 301 may include a multiplier 312b configured to multiply [e(n)*(ref(n−1)−ref(n))] by delμ as also indicated by the delay adaptation equation. This product may then be communicated to a summer 310b configured to receive the product and the delay of the previous sample (e.g., d(n−1)). Sumer 310b may add [(e(n)*(ref(−1)−ref(n)))*delμ] with [d(−1)] to produce the delay for the current sample (d(n)) as indicated by the delay equation above. This d(n) may be communicated to delay adjustment module 254 such that ref(n) may be time aligned with crx(n) according to d(n).

Therefore, in the present example, gain and delay module 248 may be configured to determine the gain of crx(n) with respect to ref(n) such that the gain error may be determined as described above. Additionally, gain and delay module 248 may be configured to determine the delay between crx(n) and ref(n) to better time align crx(n) and ref(n) such that a more accurate gain between the two may be determined. Additionally, gain and delay module 248 of FIG. 3 may be configured to communicate the determined e(n) to a interference detection module 260 of FIG. 2 (not expressly shown in FIG. 3) such that interference detection module 260 may determine whether a blocker is present based at least in part on e(n).

Modifications, additions or omissions may be made to FIG. 3 without departing from the scope of the present disclosure. For example, in addition to gainμ and delμ, gain and delay module 248 may also include and error scaling factor that may be multiplied by the difference between (g(n)*ref(n)) and crx(n) to adjust the value of e(n). The scaling may be done to reduce ripples in steady state operations or to decrease the amount of time required to reach steady state operations.

Although the present disclosure and its advantages have been described in detail, it should be understood that various changes, substitutions and alterations can be made herein without departing from the spirit and scope of the disclosure as defined by the following claims.

What is claimed is:

1. A wireless communication element comprising:
a transmit path configured to convert a digital signal into a wireless communication signal;
an antenna coupled to the transmit path and configured to transmit the wireless communication signal;
a feedback receive path communicatively coupled between the antenna and transmit path and configured to receive a feedback signal indicative of a power level of the wireless communication signal transmitted from the transmit path to the antenna; and
an error tracking path coupled to the feedback receive path, the error tracking path configured to:
receive the feedback signal;
compensate for a gain imbalance between an I channel component and a Q channel component of the feedback signal such that the gain of the I channel component and the gain of the Q channel component are approximately equal;
compensate for a phase imbalance between the I channel component and the Q channel component of the feedback signal such that the I channel component and the Q channel component are in approximately quadrature phase with each other;
receive a reference signal associated with the digital signal;
determine a gain of the feedback signal with respect to the reference signal;
determine a gain error based on the determined gain and an expected gain; and
detect interference associated with the wireless communication signal based on an unexpected change in a magnitude of the feedback signal and a corresponding change in a difference between the feedback signal and the reference signal multiplied by the determined gain.

2. The wireless communication element of claim 1, the error tracking path configured to time align the feedback signal with the reference signal.

3. The wireless communication element of claim 2, the error tracking path configured to time align the feedback signal with the reference signal based on a delay between the reference signal and the feedback signal, the delay determined using an adaptive error tracking algorithm.

4. The wireless communication element of claim 1, the error tracking path configured to determine the gain of the feedback signal using an adaptive error tracking algorithm.

5. The wireless communication element of claim 4, the adaptive error tracking algorithm comprising at least one of a least mean squares algorithm and a recursive least squares algorithm.

6. The wireless communication element of claim 1, the transmit path further configured to adjust a power level of the wireless communication signal based on the gain error.

7. The wireless communication element of claim 1, the error tracking path further configured to adjust the feedback signal to compensate for frequency gain droop associated with the feedback signal.

8. A method for tracking power levels of a wireless communications signal comprising:
receiving a feedback signal indicative of a power level of a wireless communication signal associated transmitted from a transmit path to an antenna of a wireless communication element;
compensating for a gain imbalance between an I channel component and a Q channel component of the feedback signal such that the gain of the I channel component and the gain of the Q channel component are approximately equal;
compensating for a phase imbalance between the I channel component and the Q channel component of the feedback signal such that the I channel component and the Q channel component are in approximately quadrature phase with each other;
receiving a reference signal associated with a digital signal converted into the wireless communication signal;

determining a gain of the feedback signal with respect to the reference signal;

determining a gain error based on the determined gain and an expected gain; and detecting interference associated with the wireless communication signal based on an unexpected change in a magnitude of the feedback signal and a corresponding change in a difference between the feedback signal and the reference signal multiplied by the determined gain.

9. The method of claim 8, further comprising time aligning the feedback signal with the reference signal.

10. The method of claim 9, further comprising:

determining a delay between the reference signal and the feedback signal using an adaptive error tracking algorithm; and time aligning the feedback signal with the reference signal based on the determined delay.

11. The method of claim 8, further comprising determining the gain of the feedback signal using an adaptive error tracking algorithm.

12. The method of claim 11, the adaptive error tracking algorithm comprising at least one of a least mean squares algorithm and a recursive least squares algorithm.

13. The method of claim 8, further comprising adjusting a power level of the wireless communication signal based on the gain error.

14. The method of claim 8, further comprising adjusting the feedback signal to compensate for frequency gain droop associated with the feedback signal.

\* \* \* \* \*